(12) United States Patent
Frumker

(10) Patent No.: US 12,174,009 B2
(45) Date of Patent: Dec. 24, 2024

(54) SCATTEROMETRY WITH HIGH HARMONIC GENERATION (HHG) SOURCES

(71) Applicant: B.G. NEGEV TECHNOLOGIES AND APPLICATIONS LTD., AT BEN-GURION UNIVERSITY, Beer Sheva (IL)

(72) Inventor: Evgeny Frumker, Beer Sheva (IL)

(73) Assignee: B.G. NEGEV TECHNOLOGIES AND APPLICATIONS LTD., AT BEN-GURION UNIVERSITY, Beer Sheva (IL)

(*) Notice: Subject to any disclaimer, the term of this patent is extended or adjusted under 35 U.S.C. 154(b) by 841 days.

(21) Appl. No.: 17/049,641

(22) PCT Filed: Feb. 24, 2019

(86) PCT No.: PCT/IL2019/050206
§ 371 (c)(1),
(2) Date: Oct. 22, 2020

(87) PCT Pub. No.: WO2019/211827
PCT Pub. Date: Nov. 7, 2019

(65) Prior Publication Data
US 2021/0239464 A1 Aug. 5, 2021

Related U.S. Application Data

(60) Provisional application No. 62/664,291, filed on Apr. 30, 2018.

(51) Int. Cl.
G02F 1/35 (2006.01)
G01B 15/04 (2006.01)

(52) U.S. Cl.
CPC ............ *G01B 15/04* (2013.01); *G02F 1/354* (2021.01)

(58) Field of Classification Search
CPC .... G01B 15/04; G01B 11/02; G01B 11/0625; G01B 2210/56; G02F 1/354; G03F 7/70616
See application file for complete search history.

(56) References Cited

U.S. PATENT DOCUMENTS 8,994,944 B2 * 3/2015 Cramer .................. G01B 11/24
356/399
9,113,540 B2 * 8/2015 Hori ...................... H01S 3/1636
(Continued)

OTHER PUBLICATIONS

EUV Scatterometer with a high-harmonic generation EUV source, Ku et al., Opitical Express, vol. 24 (24), Nov. 28, 2016.
(Continued)

*Primary Examiner* — David P Porta
*Assistant Examiner* — Mamadou Faye
(74) *Attorney, Agent, or Firm* — Dority & Manning, P.A.

(57) ABSTRACT

A method for extending scatterometry measurements of periodic structures created on a substrate into the deep UV and soft X-ray regions of the electromagnetic spectrum is presented. The method comprises measuring the scattering of a high harmonic generated (HHG) beam, which is created by a driving laser, that is scattered from the structures on the substrate. The scattered HHG beam is measured by a spectrometer or a detector sensitive to HHG radiation. Also presented is a system for carrying out the method.

8 Claims, 4 Drawing Sheets

(56) References Cited

U.S. PATENT DOCUMENTS

2016/0025480 A1* 1/2016 Goodwin ........... G01B 9/02097
                                                  356/498
2017/0315456 A1* 11/2017 Lin ..................... H01S 3/1305
2019/0204757 A1* 7/2019 Brussaard ........... G03F 7/70616

OTHER PUBLICATIONS

Fiber Bragg grating inscription combining DUV sub-picosecond laser pulses and two-beam interferometry, Becker et al., Optics Express, vol. 16(23), Nov. 10, 2008, pp. 19169-178.
International Search Report for PCT/IL2019/050206 dated May 21, 2019, 3 pages.
Written Opinion for PCT/IL2019/050206 dated May 21, 2019, 4 pages.

* cited by examiner

SCATTEROMETRY WITH HIGH HARMONIC GENERATION (HHG) SOURCES

CROSS REFERENCE TO RELATED APPLICATIONS

This application is the U.S. National Stage entry of International Application Number PCT/IL2019/050206 filed under the Patent Cooperation Treaty having a filing date of Feb. 24, 2019, which claims priority to U.S. Provisional Patent Application No. 62/664,291 having a filing date of Apr. 30, 2018, which are incorporated herein by reference.

FIELD OF THE INVENTION

The invention is from the field of optics. Specifically it is from the field of scatterometry.

BACKGROUND OF THE INVENTION

Publications and other reference materials referred to herein are numerically referenced in the following text and respectively grouped in the appended Bibliography which immediately precedes the claims.

The progress in microelectronics (these days already nanoelectronics) and related technologies (computers, cellphones, memories, etc.) has been steadily driven by miniaturization of the feature sizes on the integrated circuits (IC) (hence increasing the density) for the last half a century.

To facilitate this progress it is essential to be able to measure these microelectronics structures. Manufacturing and fabrication of the IC can't be done without monitoring and control of the process.

One of the key technologies used for these measurements is scatterometry, which is a non-imaging optical metrology technique. It is based on the observation and analysis of changes in intensity of light scattered from a periodic micro/nano structure. Scatterometry is based on the dependence of the diffraction/scattering efficiency from the sample to variation in the exact form factor and material composition of the sample.

Currently, state-of-the art scatterometry measurements in the industry are typically performed in the spectral range of 200 nm-1000 nm or part of this spectrum. Since the significance in scatterometry measurements, i.e. how easily or efficiently or to which extent the measured structure can be characterized or changes to the measured structure detected from the observed scattered signal, is inversely proportional to the measured wavelength, this implies that shorter wavelengths will facilitate reconstruction of more complex structures and provide better sensitivity and resolution. Therefore extending the measurements into the deep UV and soft X-ray spectral range has a potential for significantly enhancing the capability and applicability of scatterometry measurements in industry.

It is therefore a purpose of the present invention to provide a method and system that is configured for performing scatterometry measurements using the deep UV and soft X-ray spectral range.

Further purposes and advantages of this invention will appear as the description proceeds.

SUMMARY OF THE INVENTION

In a first aspect the invention is a method of measuring in the UV, XUV, x-ray spectral region the reflectance of a sample comprised of structures created on a substrate as a function of incident angle, polarization, wavelength, the scattered light angle, and, in the case of a periodic structure, the diffraction order. The method comprises:

(a) focusing amplified femtosecond pulses of light from a laser into a high harmonic generated (HHG) medium, thereby generating a HHG beam;
(b) directing the HHG beam to fall on the sample;
(c) scanning the HHG beam relative to the sample;
(d) measuring the intensity of the scattering/diffraction pattern of the HHG beam scattered/diffracted by the sample using a grazing incidence XUV spectrometer;
(e) repeating steps (a) to (d) for a well-calibrated sample for which the reflectance as a function of wavelength and polarization is known; and
(f) determining the reflectance of the sample from the measured intensity of the scattering/diffraction pattern of the sample and the measured intensity of the scattering/diffraction pattern and known reflectance of the well-calibrated sample.

Embodiments of the method comprise the additional step of applying scatterometry algorithms to the reflectance determined in step (f) in order to determine properties of the structures created on the substrate.

In embodiments of the method the grazing incidence XUV spectrometer is replaced with one of the following:
(a) an XUV spectrometer;
(b) a deep UV spectrometer;
(c) a soft X-ray spectrometer; and
(d) a detector sensitive to HHG radiation.

In embodiments of the method the scanning is at least one of linear and rotational.

In a second aspect the invention is a system for extending scatterometry measurements of periodic structures created on a substrate into the deep UV and soft X-ray regions of the electromagnetic spectrum. The system comprises:

a) a femtosecond laser system;
b) a focusing lens;
c) a HHG medium;
d) an XUV spectrometer; and
e) an arrangement for scanning a HHG beam relative to the sample.

In embodiments of the system the grazing incidence XUV spectrometer is replaced with one of the following:
(a) an XUV spectrometer;
(b) a deep UV spectrometer;
(c) a soft X-ray spectrometer; and
(d) a detector sensitive to HHG radiation.

Embodiments of the system may comprise at least one of:
a) a polarization rotator;
b) a spectral broadening apparatus;
c) a dispersion control assembly;
d) an optical parametric amplifier; and
e) HHG beam focusing optics.

In embodiments of the system the HHG focusing optics may comprise at least one of reflective and diffractive elements.

All the above and other characteristics and advantages of the invention will be further understood through the following illustrative and non-limitative description of embodiments thereof, with reference to the appended drawings.

DETAILED DESCRIPTION OF EMBODIMENTS OF THE INVENTION

The invention is a method of extending scatterometry measurements of periodic structures created for example on silicon or any other substrate into the deep UV and soft X-ray regions of the electromagnetic spectrum. The method is carried out by measuring the diffraction/scattering patterns of a high harmonic generated (HHG) beam from a sample, i.e. structures on the surface of the substrate. The scattered/diffracted beam is measured using a grazing incidence XUV spectrometer (schematically shown in FIG. 1). The high harmonic beam is generated by focusing a driving laser into high harmonic generation (HHG) medium.

Figure 1:
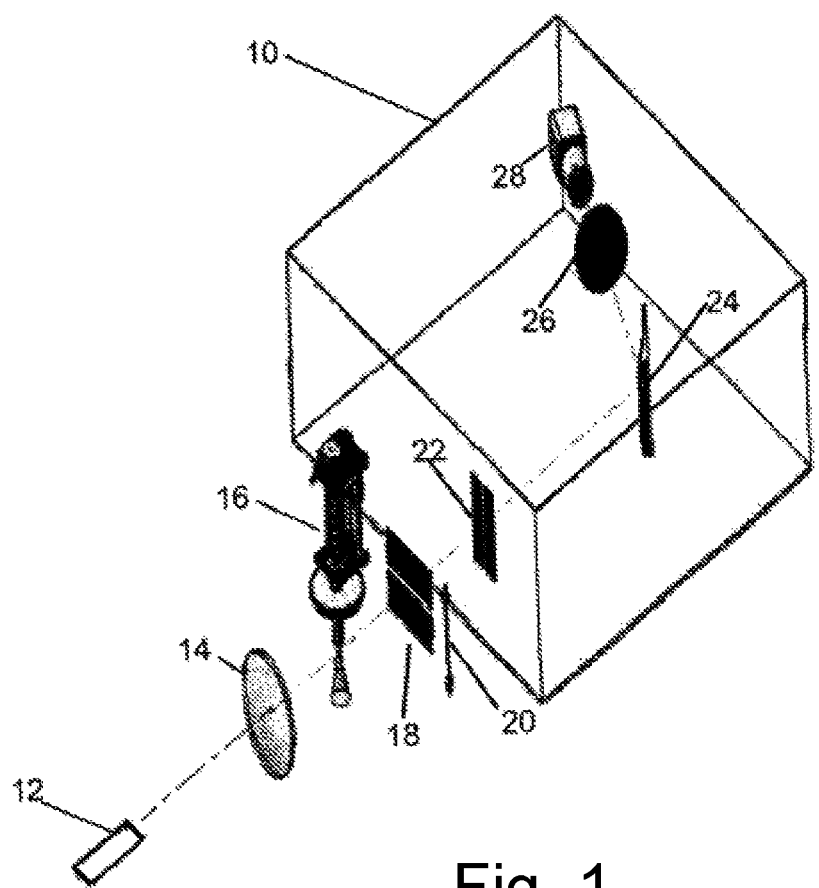
FIG. 1 schematically shows a prior art optical setup for obtaining spectrally resolved high harmonic wavefronts by measuring diffractograms of high-harmonics obtained by passage through a XUV spectrometer of a HHG beam diffracted through a scanning slit.

The optical setup that is described in [1] is shown schematically in FIG. 1. In this system amplified femtosecond pulses of light from laser 12 are focused by focusing optics 14 into a HHG medium (schematically shown as gas jet 16). The HHG beam is then focused on the sample 18, which in [1] was a slit mounted so that it could be moved up and down vertically as indicated by arrow 20 in the figure. After interacting with sample 18, the HHG beam passes through entrance slit 22 of XUV spectrometer 10. The main components of spectrometer 10 are the diffraction grating 24 and either a XUV CCD camera or, as shown in FIG. 1, a microchannel plate MCP 26 whose backside phosphor screen is imaged onto a CCD camera or CMOS camera 28.

Methods of generating HHG beams and the components of XUV spectrometer 10 are well known in the art and will not be described herein. A typical diffraction grating 24 that can be used for the scatterometer measurements is described, for example in [2]. A suitable imaging MCP is supplied, for example, by Photonis USA Inc., Sturbridge Mass., USA and a suitable XUV CCD camera is, for example, a Newton SO model manufactured by Andor Technology Ltd., Belfast, Northern Ireland.

Figure 2:
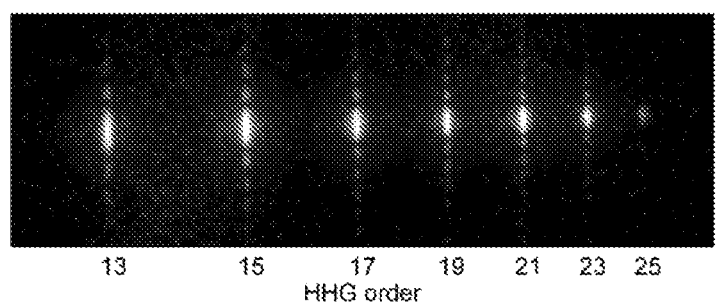
FIG. 2 shows a logarithmic image of a high-harmonic spectrum diffracted through a scanning slit using the optical setup of FIG. 1.

FIG. 2 taken from [1], is a logarithmic image of a high-harmonic spectrum obtained by passage of a HHG beam diffracted through scanning slit 18 and imaged by camera 28 in spectrometer 10. As the slit is scanned through the beam, the horizontal direction in the image gives the spectrum shown in FIG. 2.

The measurements are carried out using a setup similar to that described in [1]. The optical setup is shown schematically in FIG. 3. In this system amplified femtosecond pulses of light from a femtosecond laser system (FLS) are focused by focusing optics (FL) into a HHG medium, which could be, for example a gas jet as shown in FIG. 1, a semi-infinite gas cell, a gas-filled capillary or a solid target. The FLS can comprise an optical parametric amplifier (OPA) in order to shift the wavelength of the driving laser to control the HHG spectrum. Some examples of possible realizations of a FLS that could be used to generate the HHG beam are a regenerative femtosecond amplified system, a multipass femtosecond amplified system, and an optical parametric chirped pulse amplifier (OPCPA) system.

Figure 3:
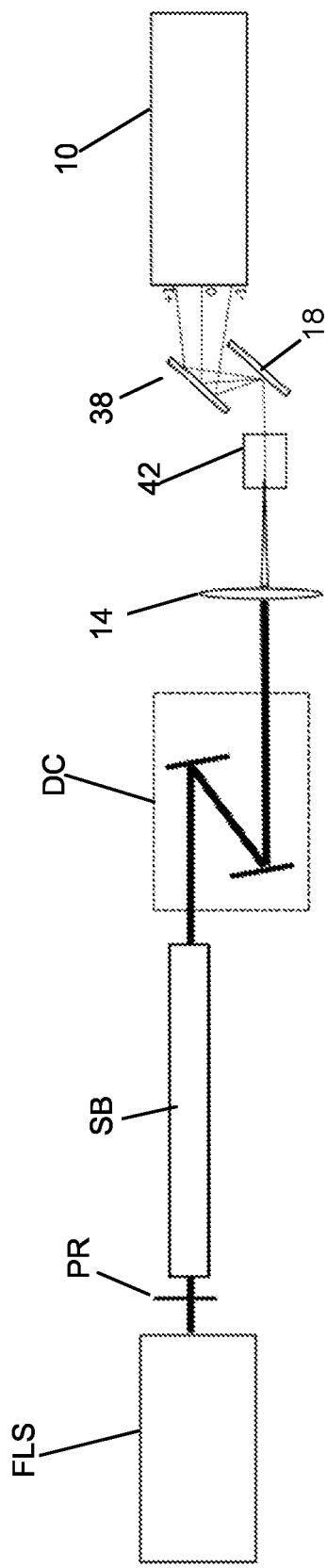
FIG. 3 schematically shows an optical setup for making scatterometry measurements using a HHG source.

Since polarization scanning and control is important for scatterometry a polarization rotator shown as (PR) is introduced into the system as shown in FIG. 3 to provide polarization control. Since the laser beam coming from a femtosecond amplifier is usually well polarized, one realization of the PR element could be a Lambda/2 waveplate. In order to improve polarization quality of the incoming beam a polarizer could be added before polarization rotator PR.

Typically the HHG spectrum is discrete while for scatterometry it is useful to have a continuous spectrum. Therefore, prior to focusing, the spectrum of the laser pulse can be optionally broadened using a spectral broadening apparatus (SB) and recompressed using a dispersion compensation assembly (DC). This will allow a continuous or semi-continuous spectrum to be obtained instead of discrete harmonics. One example of a SB is a hollow fiber filled with inert gas; another is a filament created in gas medium. Examples of a DC are a set of chirped mirrors or a prism based compressor.

The HHG beam is then directed to fall on the sample 18, which in [1] was a slit mounted so that it could be moved up and down vertically as indicated by arrow 20 in FIG. 1. In the present invention, in place of the slit, sample 18 is a substrate on which periodic features have been created using techniques known in the semiconductor industry. In embodiments of the invention XUV focusing optics (not shown in FIG. 3), which can be either reflective or diffractive can be placed between HHG medium 42 and the sample 18. The substrate is mounted on a stage that can move the substrate in the plane perpendicular to the beam propagation, to facilitate measurement of a specific sample area. The stage can also rotate the sample to allow the incident angle of the HHG beam on the sample to be changed. Various embodiments of ways of mounting the substrate will be described herein below with reference to FIGS. 4A to 4C. After interacting with sample 18, the HHG beam passes through the entrance slit of XUV spectrometer 10. The main components of the spectrometer 10 are shown in FIG. 1. They are the diffraction grating 24 and either a XUV CCD camera or, as shown in FIG. 1, a microchannel plate MCP 26 whose backside phosphor screen is imaged onto a CCD camera or CMOS camera 28. If the scattering angle of the HHG beam from the sample is larger than the acceptance angle of the spectrometer 10, the spectrometer can be rotated around axis 30 in vertical plane to facilitate the measurement of the scattered light across the full scattering angle.

In embodiments of the system, the grazing incidence XUV spectrometer shown in FIG. 3 can be replaced with one of the following:

(a) an XUV spectrometer;
 (b) a deep UV spectrometer;
 (c) a soft X-ray spectrometer; and
 (d) any type of detector sensitive to the HHG radiation.

Figure 4A:
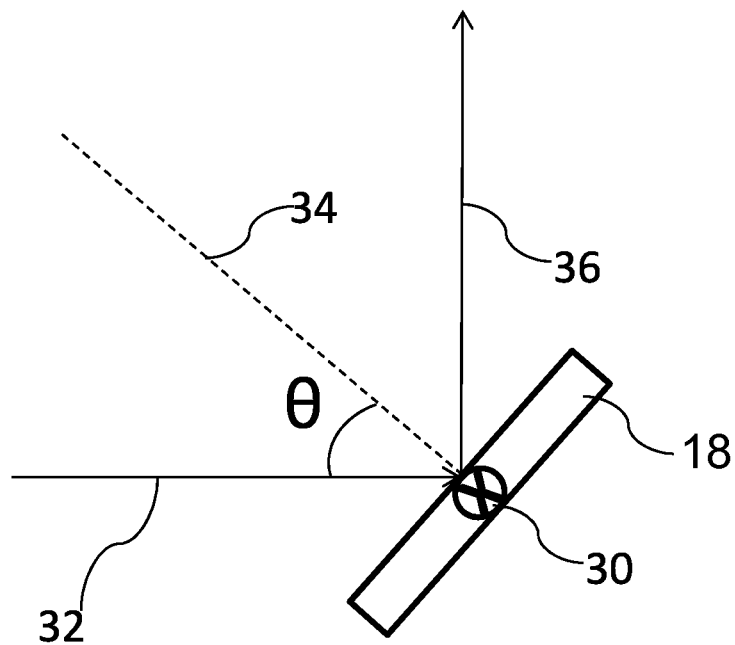
FIGS. 4A to 4C show three possible ways of mounting the substrate to allow the angle of incidence of the HHG beam on the substrate to be changed and the diffracted light to be effectively measured.
Figure 4B:
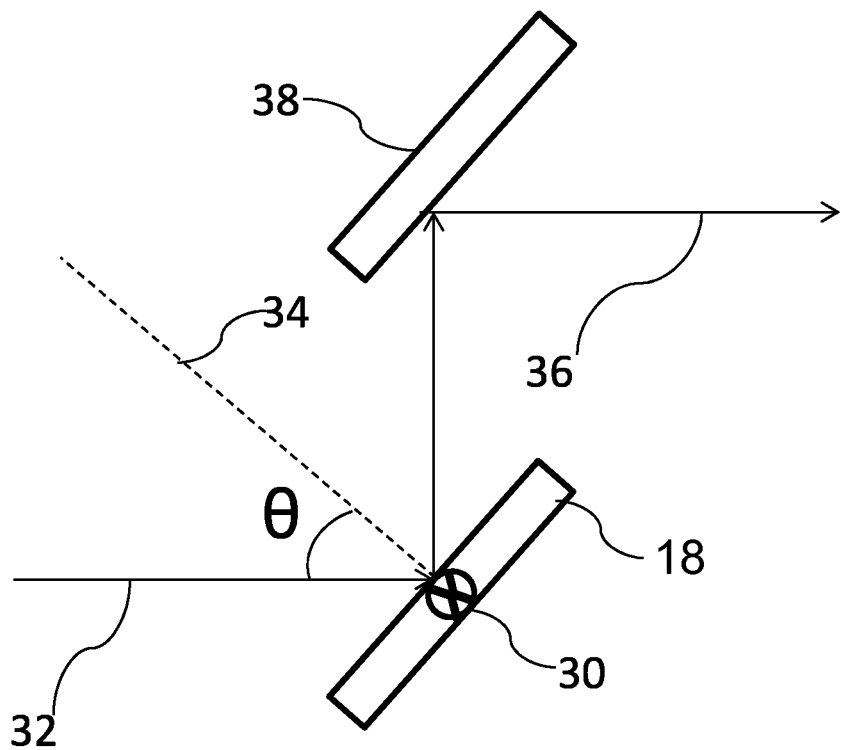
Figure 4C:
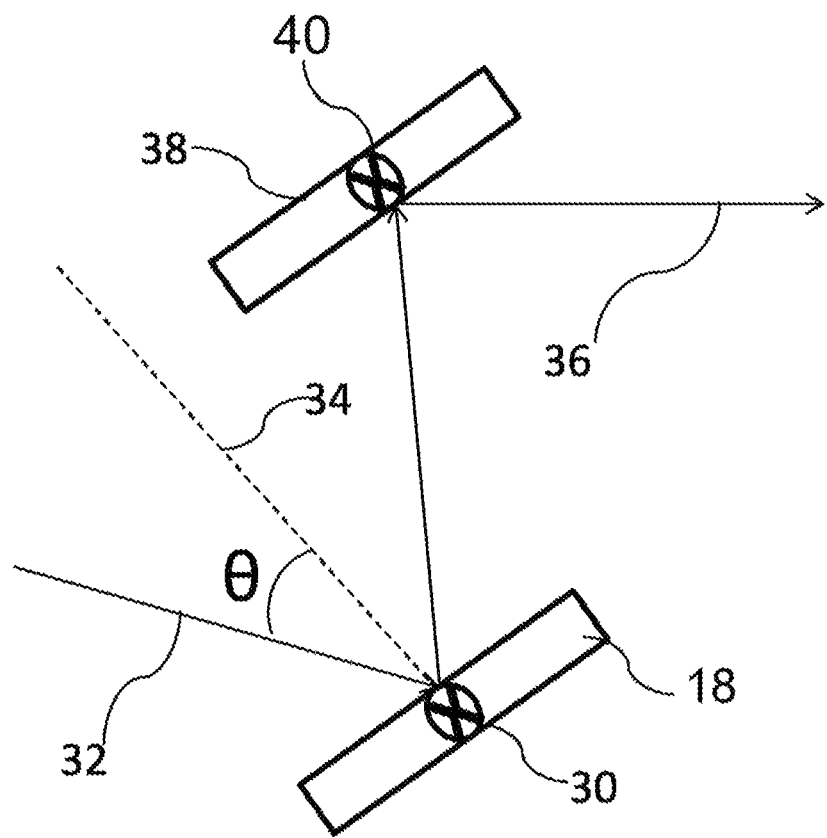

For scatterometry measurements it is important to be able to measure the scattering from features on the substrate as a function of the angle of incidence of the incoming beam. FIGS. 4A to 4C show three possible ways of mounting the substrate to allow the angle of incidence of the HHG beam on the substrate to be changed.

In FIG. 4A, the sample 18 is rotated around axis 30. Axis 30 is in the plane of the sample, passes through the point of incidence of the point at which the incident beam 32 hits the sample, and is perpendicular to the plane defined by the normal to the sample 34 and the incident beam 32. The advantage of this embodiment is its simplicity. However as angle θ between the normal to the sample 34 and the incident beam 32 changes, the direction of the reflected beam 36 also changes such that the reflected beam 36 drifts off of slit 22 of the spectrometer (see FIG. 1). Therefore, as the measurements are being carried out, spectrometer 10 has to be rotated along with the sample 18.

In order to prevent the technically difficult task of rotating the spectrometer in FIG. 4B, a folding mirror 38 is introduced into the optical path between the sample 18 and the spectrometer slit 22. The plane of mirror 38 is parallel to that of sample 18. Both sample 18 and mirror 38 are mounted on the same mount and rotate together about a single axis 30. The advantage of this arrangement is that the beam direction doesn't change as the sample is rotated. However the diffraction pattern shifts in the vertical direction on MCP 26 and camera 28 as the sample rotates. This shift has to be taken into account in analyzing the data.

In the embodiment shown in FIG. 4C, folding mirror 38 is rotated about axis 40 in synchronization with the rotation of sample 18 rotated about axis 30. Axis 40 is parallel to axis 30 and passes through the point of incidence of the point at which the reflected beam 36 hits folding mirror 38. In this embodiment both the direction and height of reflected beam 36 remain constant as the incident angle Θ is scanned.

As the scanning angle can be achieved using any of the configurations shown in FIGS. 4A-4C. The embodiment of FIG. 4C is shown in FIG. 3. In FIG. 3, the grating grooves on the sample which is going to be measured are perpendicular to the plane of the figure. In FIG. 3 the 0 and ±1 orders are shown; however, in a real system different numbers of diffraction orders can be measured (for example, only the zero order or a large number of orders can be obtained). In FIG. 3 the diffraction orders are projected in the vertical direction and the spectrometer resolves the wavelength in the horizontal direction—both as shown in FIG. 2.

As the sample 18 is rotated around axis 30, the ratio of the intensity of the beam reflected from the sample to that reflected from a blank, well characterized substrate placed instead of the sample for calibration and the polarization parameters provide the information used to reconstruct the structure on the sample substrate exactly as is done in scatterometry using visible wavelengths.

By means of the components shown in FIG. 3 and described herein above, the scatterometry system of the invention facilitates the spectrally resolved sample reflectance measured as a function of incident polarization, angle of incidence, the diffraction order, and the angle of scattering, which provides the directional/spatial resolution of the scattered light. This comprises the most comprehensive set of measured parameters that can be used in scatterometry.

Although embodiments of the invention have been described by way of illustration, it will be understood that the invention may be carried out with many variations, modifications, and adaptations, without exceeding the scope of the claims.

BIBLIOGRAPHY

[1] E. Frumker, et al., "Frequency-resolved high-harmonic wavefront characterization", OPTICS LETTERS, Vol. 34, No. 19, pgs. 3026-3028, Oct. 1, 2009.
[2] Toshiaki Kita, et al., "Mechanically ruled aberration-corrected concave gratings for a flat-field grazing-incidence spectrograph" APPLIED OPTICS, Vol. 22, No. 4, pgs. 512-513, Feb. 15, 1983.

The invention claimed is:

1. A method of measuring in the UV, XUV, x-ray spectral region the reflectance of a sample comprised of structures created on a substrate as a function of incident angle, polarization, wavelength, the scattered light angle, and, in the case of a periodic structure, the diffraction order; the method comprising:
   (a) providing a femtosecond laser system configured to produce amplified femtosecond pulses of light;
   (b) passing the amplified femtosecond pulses of light through a polarization rotator configured to provide polarization scanning and control of the amplified femtosecond pulses;
   (c) passing the amplified femtosecond pulses of light that have passed through the polarization rotator through focusing optics into a high harmonic generated (HHG) medium comprising one of: a gas jet, a semi-infinite gas cell, a gas-filled capillary, or a solid target, thereby generating a polarized spatially coherent HHG beam;
   (d) directing the polarized spatially coherent HHG beam to fall on the sample;
   (e) scanning the polarized spatially coherent HHG beam relative to the sample from which the polarized spatially coherent HHG beam is scattered/diffracted;
   (f) directing a scattering/diffraction pattern of the polarized spatially coherent HHG beam that is scattered/diffracted by the sample to a grazing incidence XUV spectrometer;
   (g) spectrally and spatially resolving the scattering/diffraction pattern of the polarized spatially coherent HHG beam that has been scattered/diffracted by the sample by a grating of the grazing incidence XUV spectrometer,
   (h) measuring the intensity of the scattering/diffraction pattern of the polarized spatially coherent HHG beam that has been spectrally and spatially resolved by the grazing incidence XUV spectrometer with a XUV CCD camera or a microchannel plate whose backside phosphor screen is imaged onto a CCD camera or CMOS camera;
   (i) repeating steps (a) to (h) for a well-calibrated sample for which the reflectance as a function of wavelength and polarization is known; and
   (j) determining the reflectance of the sample from the measured intensity of the scattering/diffraction pattern from the sample and the measured intensity from the scattering/diffraction pattern and known reflectance of the well-calibrated sample;
   wherein:
   I) the polarization rotator is configured to be activated to scan the polarization of the amplified femtosecond pulses of light; and
   II) scanning the polarized spatially coherent HHG beam relative to the sample is accomplished by mounting the sample on a stage that is configured to move the sample in the plane perpendicular to the polarized spatially coherent HHG beam propagation to facilitate measurement of a specific sample area and also to rotate the sample allowing the incident angle of the polarized spatially coherent HHG beam on the sample to be changed; thereby, allowing creation of a spatially coherent polarization-dependent scatterometry data set from different areas on the sample.

2. The method of claim 1 comprising the additional step of applying scatterometry algorithms to the reflectance determined in step (j) in order to determine properties of the structures created on the substrate.

3. The method of claim 1, wherein the grazing incidence XUV spectrometer is replaced with one of the following:
(a) an XUV spectrometer;
(b) a deep UV spectrometer; and
(c) a soft X-ray spectrometer.

4. The method of claim 1, wherein the scanning is at least one of linear and rotational.

5. A system for extending scatterometry measurements of periodic structures created on a substrate into the deep UV and soft X-ray regions of the electromagnetic spectrum, the system comprising:
   a) a femtosecond laser system;
   b) a polarization rotator;
   c) a focusing lens;
   d) a HHG medium;
   e) a grazing incidence XUV spectrometer; and
   f) an arrangement for scanning a HHG beam relative to a sample;
wherein:
i) the polarization rotator is configured to rotate the polarization of the laser beam coming from the femtosecond laser system;
ii) the HHG medium comprises one of: a gas jet, a semi-infinite gas cell, a gas-filled capillary, or a solid target;
iii) directing the laser beam coming from the femtosecond laser system through the polarization rotator and focusing the polarized laser beam into the HHG medium creates a polarized spatially coherent HHG beam;
iv) a grating of the grazing incidence XUV spectrometer is configured to spectrally and spatially resolve the scattering/diffraction pattern of the polarized spatially coherent HHG beam after it has been scattered/diffracted by the sample;
v) the polarization rotator is configured to be activated to scan the polarization of the amplified femtosecond pulses of light; and
vi) the arrangement for scanning the polarized coherent HHG beam relative to the sample comprises a stage on which the sample is mounted, the stage is configured to move the sample in the plane perpendicular to the polarized spatially coherent HHG beam propagation to facilitate measurement of a specific sample area and also to rotate the stage allowing the incident angle of the polarized spatially coherent HHG beam on the sample to be changed; thereby, allowing creation of a spatially coherent polarization-dependent scatterometry data set from different areas on the sample.

6. The system of claim 5, wherein the grazing incidence XUV spectrometer is replaced with one of the following:
(a) an XUV spectrometer;
(b) a deep UV spectrometer; and
(c) a soft X-ray spectrometer.

7. The system of claim 5 comprising at least one of:
   a) a spectral broadening apparatus;
   b) a dispersion control assembly;
   c) an optical parametric amplifier; and
   d) HHG beam focusing optics.

8. The system of claim 7, wherein the HHG focusing optics comprises at least one of reflective and diffractive elements.

* * * * *